United States Patent [19]

Hikata et al.

[11] Patent Number: 5,236,891
[45] Date of Patent: Aug. 17, 1993

[54] METHOD OF PREPARING BISMUTH OXIDE SUPERCONDUCTOR COMPRISING HEATING UNDER A REDUCED PRESSURE

[75] Inventors: Takeshi Hikata; Kenichi Sato, both of Osaka, Japan

[73] Assignee: Sumitomo Electric Industries, Ltd., Osaka, Japan

[21] Appl. No.: 742,255

[22] Filed: Aug. 8, 1991

[30] Foreign Application Priority Data

Aug. 8, 1990 [JP] Japan ................................ 2-211365

[51] Int. Cl.$^5$ .................... C01F 11/02; C01G 3/02; C01G 29/00; H01L 39/24
[52] U.S. Cl. ................................ 505/1; 264/60; 505/740; 505/782
[58] Field of Search .................... 505/740, 704, 1, 782; 264/60

[56] References Cited

U.S. PATENT DOCUMENTS 5,093,314  3/1992  Takahashi ........................ 505/704

FOREIGN PATENT DOCUMENTS

| 0379960 | 8/1990 | European Pat. Off. | |
| 0080304 | 3/1990 | Japan | 505/740 |
| 0153823 | 6/1990 | Japan | 505/782 |
| 0207422 | 8/1990 | Japan | 505/740 |
| 0129611 | 6/1991 | Japan | 505/740 |
| 0163714 | 7/1991 | Japan | 505/740 |

OTHER PUBLICATIONS

Uno "Synthesis of Bi-Sr-Ca-Cu-O Superconductors by Vacuum Calcination ... ", Jap. Jnl. Appl. Phys. v. 27(6), Jun. 1988, pp. L1013–L1014.
Soeta "Microstructures of $YBa_2Cu_3O_7$ with various critical ... ", pp. 243–245.
Extended Abst: High Temp Superconductors II Apr. 5–9, 1988.
McCallum "Problems in the production of $YBa_2Cu_3O_x$ ... ", Adv. Ceramic Mat'ls. v. 2(3B) 1987, pp. 388–400.
H. Sekine et al "Studies On The Non Rare Earth Oxide Superconductors Fabricates By Sintering" IEEE Transactions on Magnetics, vol. 25, No. 2, Mar. 1989, pp. 2164–2167 *Experimental Procedure*.

Primary Examiner—Paul Lieberman
Assistant Examiner—John Boyd
Attorney, Agent, or Firm—Pennie & Edmonds

[57] ABSTRACT

Disclosed herein is a method of preparing a bismuth oxide superconductor by forming a superconducting phase having a 2223 composition or a 2212 composition in a composition of Bi-Sr-Ca-Cu or (Bi,Pb)-Sr-Ca-Cu in a metal sheath. This method comprises the steps of preparing raw material powder containing a mixture of a 2212 phase having the 2212 composition and non-superconducting phases, carrying out a process of heat treating the raw material powder under a reduced pressure of not more than 1 atm. immediately before filling the same into the metal sheath and thereafter cooling the same under an oxygen atmosphere, and filling the raw material powder into the metal sheath and thereafter performing deformation processing and heat treatment on the metal sheath. This method is suitable for preparation of a long wire.

3 Claims, No Drawings

METHOD OF PREPARING BISMUTH OXIDE SUPERCONDUCTOR COMPRISING HEATING UNDER A REDUCED PRESSURE

BACKGROUND OF THE INVENTION

1. Field of the Invention

The present invention relates to a method of preparing a bismuth oxide superconductor, and more particularly, it relates to a method of preparing a bismuth oxide superconductor, which is capable of improving the critical current density and suitable for preparation of a long wire.

2. Description of the Background Art

In recent years, superconductive materials of ceramics, i.e., oxide superconductive materials, are watched as materials which exhibit higher critical temperatures. For example, a bismuth oxide superconductive material, which exhibits a high critical temperature of about 110 K., is expected as a practicable superconductive material.

It is known that a bismuth oxide superconductor has a phase showing a critical temperature of 110 K. and those showing critical temperatures of 80 K. and 10 K.

In relation to such a bismuth oxide superconductor, it is also known that the 110 K. phase has a 2223 composition in a composition of Bi-Sr-Ca-Cu, or (Bi,Pb)-Sr-Ca-Cu with partial substitution of Pb for Bi, while the 80 K. phase has a 2212 composition of the same elements.

In a method of preparing an oxide superconductor, raw material for the oxide superconductor is filled into a metal sheath and subjected to deformation processing and heat treatment, so that the raw material contained in the metal sheath is brought into a superconducting state. This method is advantageously applied to preparation of a long superconducting wire, for example.

A process of preparing such an oxide superconductor includes at least a heat treatment step, and it has been recognized that a sufficient amount of oxygen must be supplied in such a heat treatment step, in order to improve the critical current density.

In order to shape a superconductor into a long wire and apply the same to a cable or a magnet, it is necessary to attain a high critical current density in addition to a high critical temperature. Further, the critical current density of the wire is preferably as uniform as possible along its overall length.

When a long superconducting wire is to be prepared as described above, the superconductor is covered with a metal sheath, in a structure basically cut off from the external atmosphere. Therefore, the wire shows such a tendency that high critical current densities are attained at its end portions, which are relatively easily influenced by the external atmosphere, while the critical current density is reduced at its central portion.

Further, the wire may be swelled by a gas which is generated from the raw material powder during heat treatment, to cause reduction of the critical current density. Although it has been recognized possible to prevent damage resulting from such swelling of the wire by performing the heat treatment under decompression, the critical current density is further remarkably reduced in this case due to oxygen deficiency caused by decompression.

SUMMARY OF THE INVENTION

Accordingly, an object of the present invention is to provide a method of preparing a bismuth oxide superconductor, which is capable of improving homogeneity of the critical current density over the longitudinal direction of a long wire, as well as improving such a critical current density itself.

The present invention is directed to a method of preparing a bismuth oxide superconductor containing elements of Bi-Sr-Ca-Cu or (Bi,Pb)-Sr-Ca-Cu, which is formed in a metal sheath. In order to solve the aforementioned technical problem, the inventive method comprises the steps of preparing raw material powder containing a mixture of a 2212 phase having a 2212 composition of the aforementioned elements and non-superconducting phases, carrying out a process of heat treating the raw material powder under a reduced pressure of not more than 1 atm. immediately before filling the powder into a metal sheath and thereafter heat treating the same under an oxygen atmosphere, and filling the raw material powder into the metal sheath and thereafter performing deformation processing and heat treatment on the metal sheath.

The term "oxygen atmosphere" indicates a state having a higher oxygen content than an ordinary atmosphere, which is preferably prepared in an oxygen flow having a pressure at least a level around the atmospheric pressure. In consideration of the object of the present invention, it is allowed to maintain the raw material powder under such an oxygen atmosphere at a constant temperature.

Preferably, a 2223 phase having a 2223 composition in the aforementioned composition is partially formed in the raw material powder, which is mainly composed of the 2212 phase.

It is preferable to repeat the step of performing deformation processing and heat treatment on the metal sheath, which is filled up with the raw material powder, a plurality of times.

As hereinabove described, the raw material powder which is heat treated under a reduced pressure is heat treated in an oxygen atmosphere so that the raw material powder is properly supplied with oxygen during heat treatment of the metal sheath, whereby it is possible to prevent the as-formed bismuth oxide superconductor from reduction of the critical current density. Further, the raw material powder can be properly supplied with oxygen also in the interior of the metal sheath which is basically cut off from the external atmosphere, whereby it is possible to substantially homogenize the critical current density over the longitudinal direction of the long superconductor. The present invention is particularly effectively applied to long a wire having a length of at least 1 m.

DESCRIPTION OF THE PREFERRED EMBODIMENTS $Bi_2O_3$, $PbO$, $SrCO_3$, $CaCO_3$ and $CuO$ were mixed with each other to prepare powder containing Bi, Pb, Sr, Ca and Cu in composition ratios of 1.8:0.4:2:2.2:3.

This powder was heat treated at 800° C. for 8 hours, and the heat treated powder was pulverized in an automatic mortar for 2 hours. Thereafter the as-formed powder was heat treated at 860° C. for 8 hours, and then the heat treated powder was again pulverized similarly to the above. The as-formed powder was divided into two parts, which were then treated as follows:

The first part of the powder, i.e., comparative example for the present invention, was further heated at 760° C. for 2 hours under a reduced pressure of 5 Torr and directly filled into a silver pipe of 6 mm in outer diameter and 4 mm in inner diameter, which in turn was subjected to wire drawing and rolling, to prepare a tape-type wire of 0.2 mm in thickness (wire 1).

The second part of the powder, i.e., Example of the present invention, was heated at 760° C. for 2 hours under a reduced pressure of 5 Torr similarly to the above, heat treated under an oxygen atmosphere of 1 atm. and thereafter filled into a similar silver pipe, to be shaped into a wire in a similar manner to the above (wire 2).

These wires 1 and 2 were heat treated at 845° C. for 50 hours in the atmosphere, thereafter rolled into thicknesses of 0.15 mm, and then heat treated at 840° C. for 50 hours respectively.

The following Table shows critical current densities of the as-formed wires 1 and 2 measured at the liquid nitrogen temperature.

TABLE

| Wire Length | Wire 1 | Wire 2 |
|---|---|---|
| 1 m | 15000 A/cm$^2$ | 30000 A/cm$^2$ |
| 2 m | 12000 A/cm$^2$ | 26000 A/cm$^2$ |
| 4 m | 9800 A/cm$^2$ | 29000 A/cm$^2$ |
| 8 m | 9500 A/cm$^2$ | 25000 A/cm$^2$ |
| 16 m | 9000 A/cm$^2$ | 25000 A/cm$^2$ |

It is understood from the above Table that a higher critical current density was obtained in the wire 2 as compared with the wire 1. Such a high critical current density was substantially maintained in the wire 2 also when its length was increased. Thus, it is understood that the wire 2 was prevented from reduction of the critical current density resulting from oxygen deficiency particularly in the central portion of the silver pipe.

Thus, according to the present invention, it is possible to obtain a bismuth oxide superconductor which shows a high critical current density also in the state of a long wire.

The raw material powder prepared in the present invention contains a mixture of a 2212 phase having a 2212 composition in the composition of Bi-Sr-Ca-Cu or (Bi,Pb)-Sr-Ca-Cu and non-superconducting phases. More preferably, the raw material powder is mainly composed of the 2212 phase, with partial formation of a 2223 phase having a 2223 composition in the aforementioned composition. Such raw material powder is so selected that it is possible to further easily obtain a 110 K. phase, which has a higher critical temperature, by heat treatment.

The step of performing deformation processing and heat treatment after filling the raw material powder into the metal sheath is repeated a plurality of times, so that the critical current density can be further improved.

What is claimed is:

1. A method of preparing a bismuth oxide superconductor by forming a superconducting phase having a 2223 composition or a 2212 composition of Bi-Sr-Ca-Cu or (Bi, Pb)-Sr-Ca-Cu in a metal sheath, said method comprising the steps of:

preparing raw material powder having a 2223 composition or a 2212 composition, said raw material powder comprising a mixture of a powder of a 2212 phase, a powder of a 2223 phase and non-superconducting phases;

carrying out a process of heat treating said raw material powder under a reduced pressure and thereafter heating the same under an oxygen atmosphere; and filling said raw material powder into said metal sheath and thereafter performing deformation processing and heat treatment on said metal sheath.

2. A method of preparing a bismuth oxide superconductor by forming said superconducting phase having said 2223 composition in accordance with claim 1, wherein said raw material powder has said 2223 composition.

3. A method of preparing a bismuth oxide superconductor in accordance with claim 1, wherein said step of performing deformation processing and heat treatment is repeated a plurality of times.

* * * * *